US008531907B2

(12) United States Patent
Ostermayr et al.

(10) Patent No.: US 8,531,907 B2

(45) Date of Patent: Sep. 10, 2013

(54) SEMICONDUCTOR MEMORY DEVICE AND METHOD

(75) Inventors: Martin Ostermayr, Beacon, NY (US); Robert Chi-Foon Wong, Poughkeepsie, NY (US)

(73) Assignees: Infineon Technologies AG, Neubiberg (DE); International Business Machine Corporation, Armonk, NY (US)

( * ) Notice: Subject to any disclaimer, the term of this patent is extended or adjusted under 35 U.S.C. 154(b) by 170 days.

(21) Appl. No.: 13/016,798

(22) Filed: Jan. 28, 2011

(65) Prior Publication Data

US 2012/0195151 A1 Aug. 2, 2012

(51) Int. Cl.
*G11C 8/00* (2006.01)
*G11C 7/00* (2006.01)

(52) U.S. Cl.
USPC ............. 365/230.05; 365/189.15; 365/189.17

(58) Field of Classification Search
USPC ........................... 365/189.15, 189.17, 230.05
See application file for complete search history.

(56) References Cited

U.S. PATENT DOCUMENTS

| | | | | |
|---|---|---|---|---|
| 5,313,551 | A * | 5/1994 | Labrousse et al. | 711/149 |
| 5,606,428 | A * | 2/1997 | Hanselman | 358/404 |
| 6,711,081 | B1 * | 3/2004 | Jain | 365/222 |
| 6,928,027 | B2 | 8/2005 | Li | |
| 7,539,076 | B1 * | 5/2009 | Vernenker et al. | 365/230.05 |
| 2010/0002531 | A1 * | 1/2010 | Lee et al. | 365/226 |
| 2011/0228594 | A1 * | 9/2011 | Rao et al. | 365/158 |

* cited by examiner

*Primary Examiner* — Ly D Pham

(74) *Attorney, Agent, or Firm* — Slater & Matsil, L.L.P.

(57) ABSTRACT

In an embodiment, a method of operating a memory cell coupled to a first port and to a second port includes determining if a first port is requesting to access the memory cell and determining if a second port is requesting to access the memory cell. Based on the determining, if the first port and the second port are simultaneously requesting to access the memory cell, the second port is deactivated, the memory cell is accessed from the first port, and an accessed memory state is propagated from the first port to circuitry associated with the second port.

26 Claims, 5 Drawing Sheets

SEMICONDUCTOR MEMORY DEVICE AND METHOD

TECHNICAL FIELD

This invention relates generally to semiconductor devices and methods, and more particularly to a semiconductor memory device and method.

BACKGROUND

Dual-port memories are memories in which two independent memory accesses operations can occur at the same time. Such memories are commonly used in applications such as video memory and multi-processing. For example, when video random access memory (VRAM) is implemented using a dual-port RAM, a processor can write an image into memory at the same time that video display circuitry is accessing the video data from memory and displaying the video data on a computer screen or video monitor. By using a dual-port RAM, wait states and memory arbitration is avoided, thereby allowing for faster operation. Using dual-port or multi-port RAM in multiprocessing applications also allows for faster operation. Here, multiple CPUs can access and write the multi-port memory without necessarily having to wait for access.

Single port static RAM (SRAM) is commonly implemented using a six transistor (6T) memory cell that includes a four transistor static latch and a pair of access transistors coupled to a differential bit line. Dual-port static RAM (SRAM), however, is commonly implemented using an eight-transistor (8T) cell that includes a four transistor static latch coupled to a plurality of differential bit lines via two pairs of access transistors. Because of the extra bit-lines and transistors, a particular dual-port memory implementation generally takes up more silicon area than its single-port counterpart. Furthermore, the dual-port SRAM cell itself tends to be larger than a single port SRAM cell for a given access speed to provide the extra drive strength needed to charge and discharge the extra bit line pair.

SUMMARY OF THE INVENTION

In an embodiment, a method of operating a memory cell coupled to a first port and to a second port includes determining if a first port is requesting to access the memory cell and determining if a second port is requesting to access the memory cell. Based on the determining, if the first port and the second port are simultaneously requesting to access the memory cell, the second port is deactivated, the memory cell is access from the first port, and an accessed memory state is propagated from the first port to circuitry associated with the second port.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a multi-port static memory. The invention may also be applied, however, to other static and dynamic memory structures.

In an embodiment, a dual-port memory cell has a first access transistor coupled to a first bit line pair, and a second access transistor coupled to a second bit line pair, where each bit line pair is operated differentially. The first bit line, or bit line pair corresponds to a first memory port, and the second bit line or bit line pair corresponds to a second memory port. During operation, memory states are accessed on the first bit pair for the first memory port, and the second bit line pair for the second memory port. When a simultaneous access on both ports for the same cell occurs, the second bit line pair is shut down, and the memory state is accessed out on the first bit line pair corresponding to the first port of the memory cell. The accessed memory state is then coupled back to circuitry associated with the second memory port. Alternatively, the memory cell can be operated in a single-ended manner, where, instead of using bit line pairs, single bit lines are used.

In one embodiment, the first bit line pair is normally coupled to a first sense amplifier corresponding to the first port, and the second bit line pair is normally coupled to a second sense amplifier corresponding to the second port. When a simultaneous access occurs, a pair of pass transistors coupled between the first bit line pair and the second sense amplifier is turned on, thereby coupling the memory state accessed from the first port of the memory to circuitry related to the second port of the memory cell. The accessed memory state is then processed by logical functions related to both the first and second memory ports such that the memory device operates externally as if the memory state was accessed from both ports. In some embodiments, a further pair of pass transistors is coupled to between the second bit line pair and the second sense amplifier. During a simultaneous access, this further pass transistor is shut off, thereby disconnecting the capacitive load of the second bit line pair from the first bit line pair. In an embodiment, the dual port memory cell is sized to drive a single port to meet the timing specifications of the memory. By sizing the memory cell to drive a single port, the overall memory cell can be made smaller than a memory cell that is optimized to drive two ports.

Figure 1:
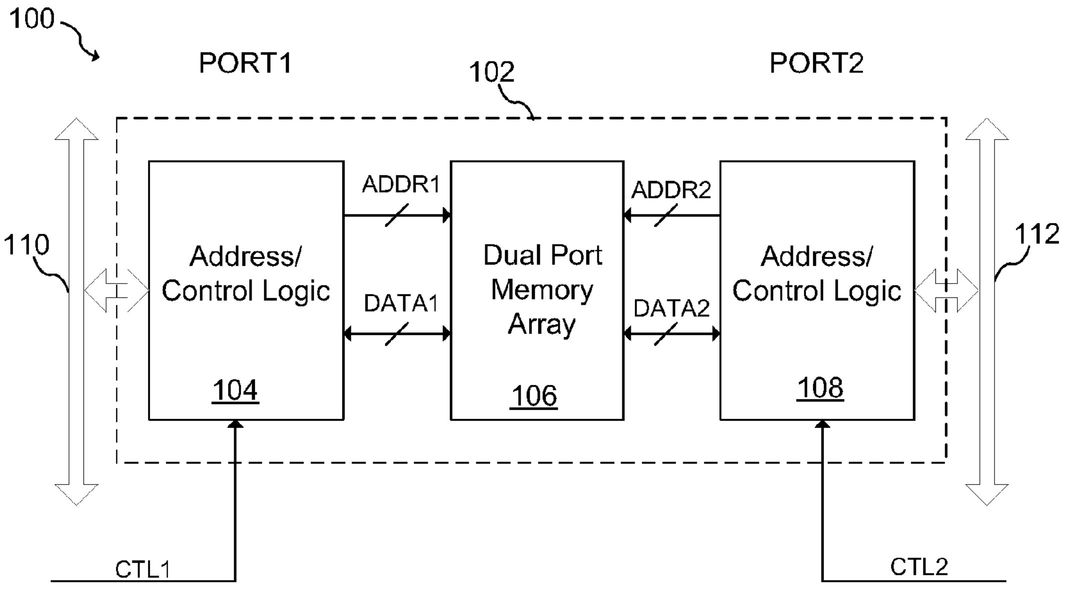
FIG. 1 illustrates an embodiment of the dual port memory.

FIG. 1 illustrates embodiment dual port memory system 100. In an embodiment, memory system 100 has memory integrated circuit (IC) 102 coupled to first memory bus 100 and second memory bus 112. Memory buses 110 and 112 are configured to provide memory address data and transmit and receive memory data according to data and addressing schemes known in the art. Access to first memory bus 110 is controlled via control signals CTL1, and access to second memory bus 112 is controlled via control signals CTL2 according to methods known in the art. In one embodiment, these control signals can include, for example, write enable, access enable, address signals, reset, and other signals related to memory control and operation. In an embodiment, the first port and the second port can be controlled independently of each other. The dual port memory can be configured to operate either synchronously or asynchronously.

Memory IC 102 has dual port memory array 106 that interfaces with address and control logic 104 of the first port, and with address and control logic 108 of the second port. In an embodiment, dual port memory array contains an array of dual port memory cells. Dual port memory array 106 receives first port address data ADDR1 and transmits/receives first port access/write data DATA1 from address and control logic 104. Likewise, dual port memory array 106 also receives second port address data ADDR2 and transmits/receives second port access/write data DATA2 from address and control logic 108.

Figure 2:
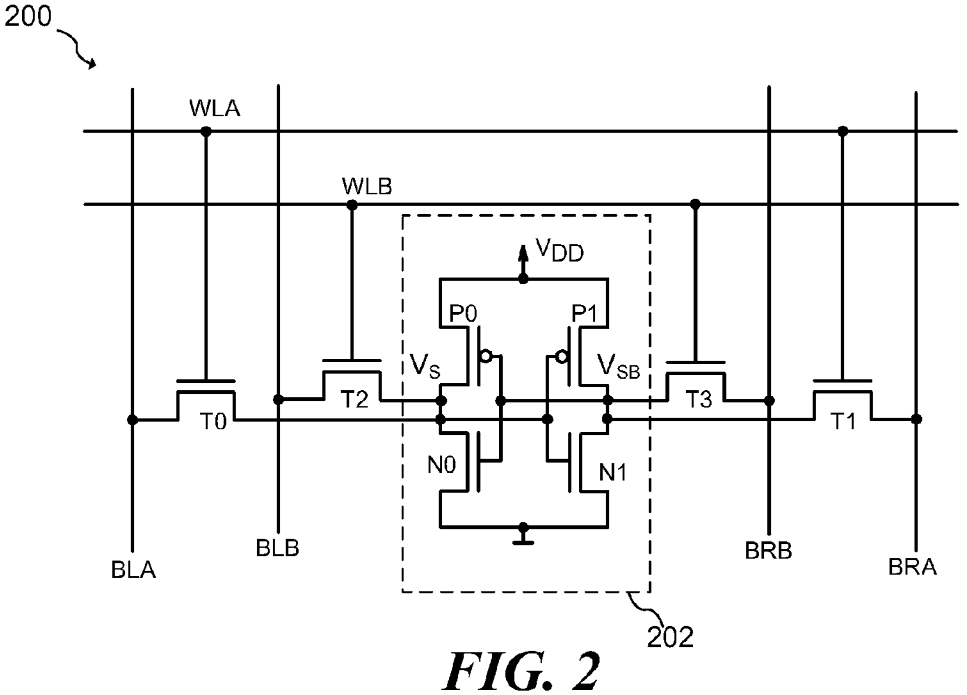
FIG. 2 illustrates an embodiment of the dual port memory.

FIG. 2 illustrates embodiment dual-port memory cell 200. Dual port memory cell has a static latch 202 made of PMOS devices P0 and P1, and NMOS devices N0 and N1. In an embodiment, these transistors form a cross-coupled inverter, where P0 and N0 form the first inverter and P1 and N1 form the second inverter. The output of static latch 202 is coupled to a first bit line pair BLA and BRA via pass transistors T0 and T1, and to second bit line pair BLB and BRB via pass transistors T2 and T3. Access to the first bit line pair is controlled with first port word line WLA coupled to the gates of T0 and T1, and access to the second bit line pair is controlled with second port word line WLB coupled to the gates of T2 and T3. In an embodiment, memory cell 202 is written from a first port by asserting a state to be stored on first bit line pair BLA and BRA, and turning on pass transistors T0 and T1. Likewise, the memory cell is written from a second port by asserting a state to be stored on second bit line pair BLB and BRB, and turning on pass transistors T2 and T3.

Figure 3A:
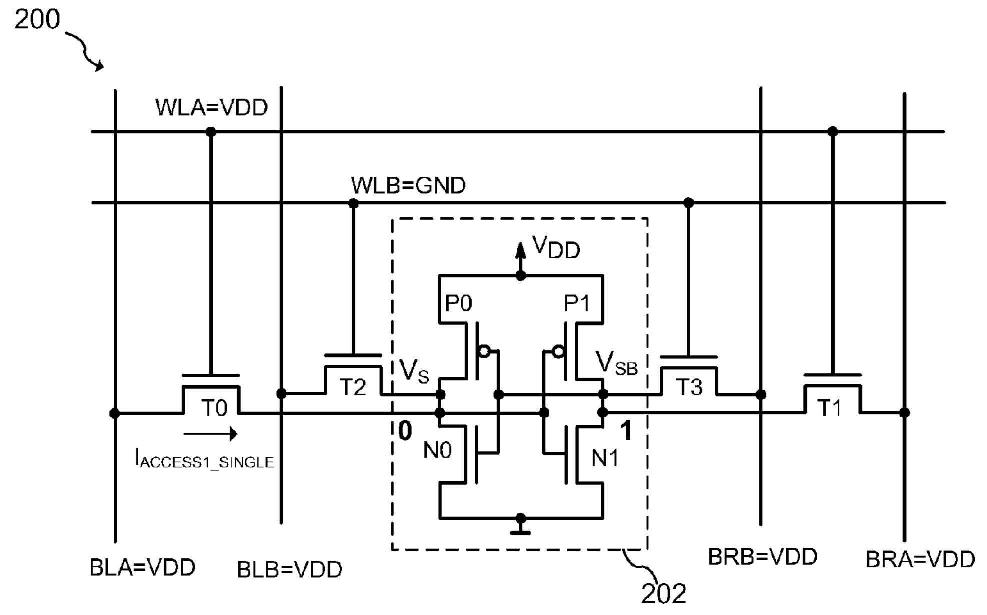
FIGS. 3*a*-3*b* illustrate the operation of a dual port memory cell.

FIG. 3*a* illustrates the state of dual port memory cell 200 during the beginning of an access operation on the first port. At the beginning of the access operation, first bit lines BLA and BRA precharged to high are released. Word line WLA is brought high, thereby activating transistors T0 and T1. In the illustrated example, node $V_S$ of latch 202 is low, and node $V_{SB}$ of latch 202 is high. Current $I_{ACCESS1\_SINGLE}$ flows though transistor T1 and discharges bit line BLA to ground potential, while BRB remains high. Performing a single port access from the second port occurs similarly, except that second bit lines BLB and BRB precharged to high are released, and pass transistors T2 and T2B are activated by word line WLB.

Figure 3B:
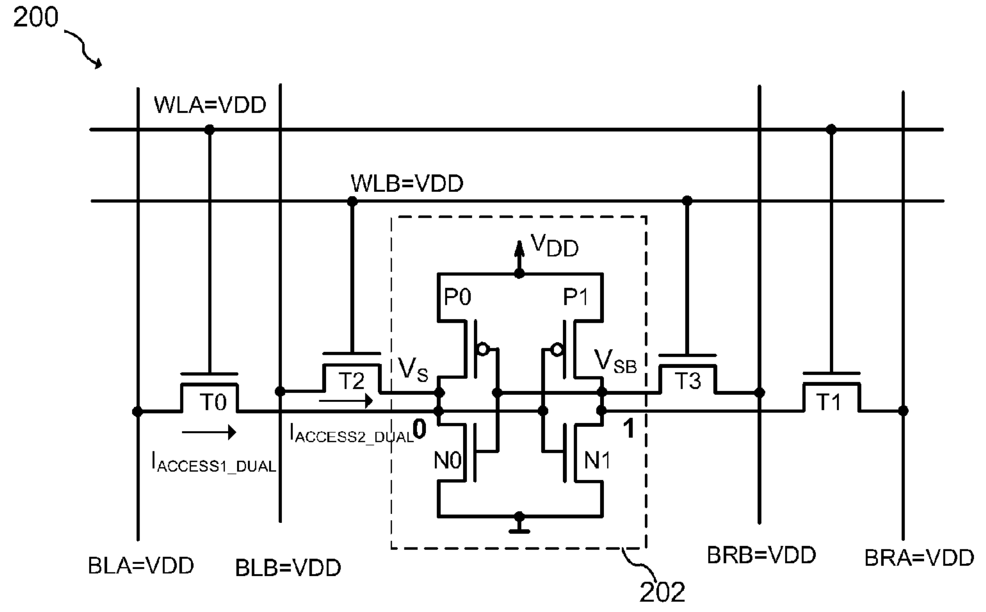

FIG. 3*b* illustrates the state of dual port memory cell 200 during the beginning of a read access operation on the first and second ports. At the beginning of the read operation, first bit lines BLA and BRA, and second bit lines BLB and BRB are precharged high. In the illustrated example, node $V_S$ of latch 202 is low, and node $V_{SB}$ of latch 202 is high. Current $I_{ACCESS1\_DUAL}$ flows though transistor T1 discharging bit line BLA, while BRA remains high, and current $I_{ACCESS2\_DUAL}$ flows though transistor T2 discharging bit line BLB, while BRB remains high. For the case of the dual read, currents $I_{ACCESS2\_DUAL}$ and $I_{ACCESS1\_DUAL}$ are reduced compared to $I_{ACCESS1\_SINGLE}$. Therefore, the bit lines will discharge slower during a dual port access than during a single port access. In order for the illustrated dual port memory cell to meet a specified access time requirement under both a single port access condition and a dual port access condition, the sizes of the transistors are made larger in order to generate enough pull-down current during the case of a dual port simultaneous access. This results in a larger memory cell that is overdesigned with respect to a single-cell access. In some cases, this memory cell can be more than twice the size of an equivalent six-transistor single port memory cell. In addition, the larger memory cells may exhibit less stability during operation due to dual port access or write attack modes.

Figure 4:
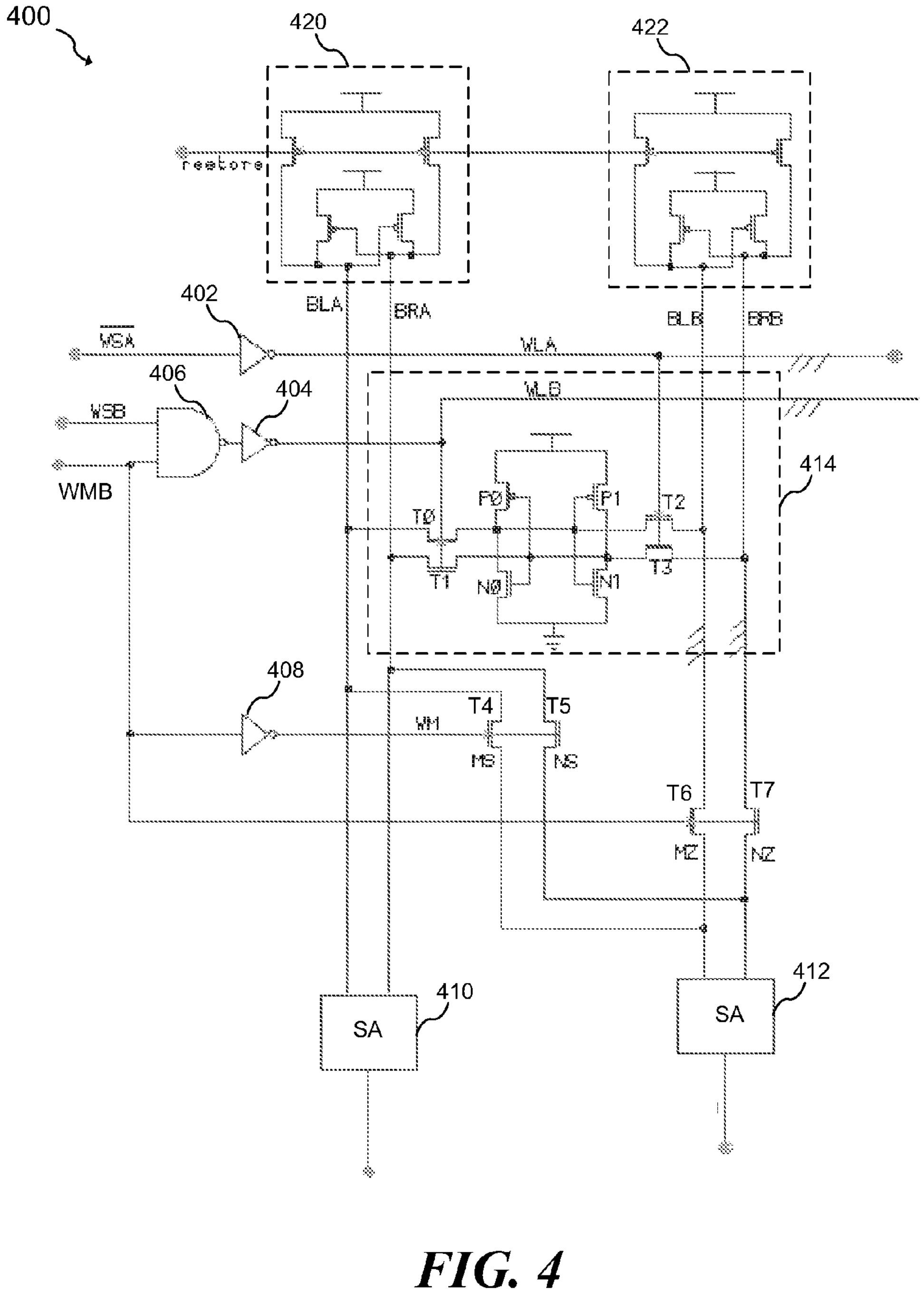
FIG. 4 illustrates an embodiment of the dual port memory system.

FIG. 4 illustrates dual port memory circuit 400 according to an embodiment of the present invention. Memory circuit 400 has eight transistor (8T) dual port memory cell 414 having a latch circuit made of PMOS transistors P0 and P1 and NMOS transistors N0 and N1. Pass transistors T0 and T1 couple the latch to first bit lines BLA and BRA, and pass transistors T2 and T3 couple the latch to second bit lines BLB and BRB. Sense amplifier 410 and pull-up circuit 420 are coupled to first bit lines BLA and BRA, and sense amplifier 412 and pull-up circuit 422 are coupled to second bit lines BLB and BRB. In an embodiment, a memory access is performed on the first memory port by charging bit lines BLA and BRA to VDD using pull-up circuit 420, activating word line WLA, and accessing the resulting state of the bit lines BLA and BRA with sense amplifier 410. Likewise, a memory access is performed on the second memory port by charging bit lines BLB and BRB to VDD using pull-up circuit 422, activating word line WLB, and accessing the resulting state of the bit lines BLB and BRB with sense amplifier 412.

In an embodiment, when a simultaneous access is performed, first port word line WLA is activated, but not second port word line WLB. First bit lines BLA and BRA are coupled to second bit lines the input of second port sense amplifier by activating pass transistors T4 and T5. Additionally, in an embodiment, second bit lines BLB and BRB are decoupled from second port sense amplifier 412 by deactivating pass transistors T6 and T7, thereby preventing the second bit lines BLB and BRB from further loading the input to sense amplifiers 410 and 412. The simultaneous access of WLA and WLB for the same cell can be read and read, read and write, write and read or write and write. In an embodiment, the sense amplifier output corresponding to the port selected for write access is simply ignored.

In an embodiment, pass transistors are controlled by logic gates 402, 404, 406 and 408. When a simultaneous access is detected by the memory system, signal WMB (Word address-Match-Bar) at the input of NAND gate 406 goes low, thereby forcing second port word line WLB to remain low, turning off pass transistors T6 and T7, and turning on pass transistors T4 and T5 via inverter 408. The memory system then asserts word line signal WLA to perform the access. In an embodiment, the memory state is sensed by first port sense amplifier 410 and by second port sense amplifier 412. Because memory cell is accessed by a single port during a dual port access, the transistors of memory cell 414, as well as pass gate transistors T0, T1, T2 and T3 are sized and optimized for a single port access in an embodiment.

It should be appreciated that while the embodiment of FIG. 4 illustrates NMOS pass transistors and a cross-coupled inverter based eight-transistor memory cell 414, other structures can be used. For example, in some embodiment, one or more pass transistors can be implemented using PMOS transistors, and other structure for the memory cell can be used, for example, ten transistor (10T) memory cells, quad-port memories, and two-port register files. It should also be appreciated that the illustrated logic gates can be achieved with alternative circuits and structures that are logically similar or equivalent.

In an embodiment, memory IC operates at a clock frequency between about 300 MHz to over 1 GHz. As such, the bit line pull down time can be between about 0.75 ns and about 2.0 ns. In alternative embodiments, other clock frequencies and other pull down times can be used depending on the embodiment and its particular specifications.

Figure 5:
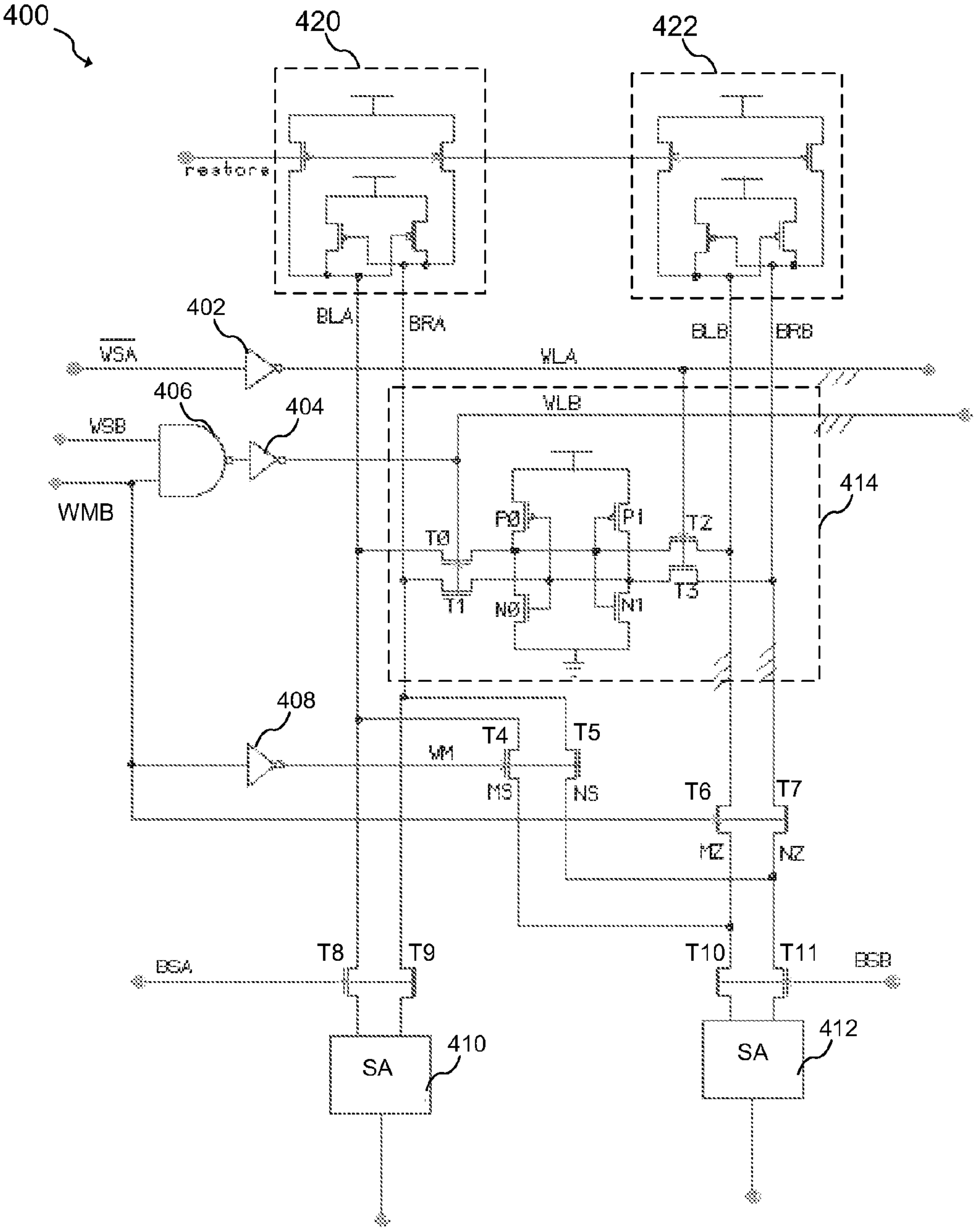
FIG. 5 illustrates a further embodiment of the dual port memory system.

FIG. 5 is similar to FIG. 4 with the addition of bit select pass transistors T8, T9, T10 and T11 coupled to sense amplifiers 410 and 412. Here bit select bit select pass transistors T10 and T11 are stacked beneath pass transistors T4, T5, T6 and T7. In an alternative embodiment, the height of the stacked devices can be reduced by combining two pass gates in series with a single pass gate, and activating the combined pass gate, for example, using a logical signal generated from an AND operation of the two inputs to the two gates in series.

Figure 6:
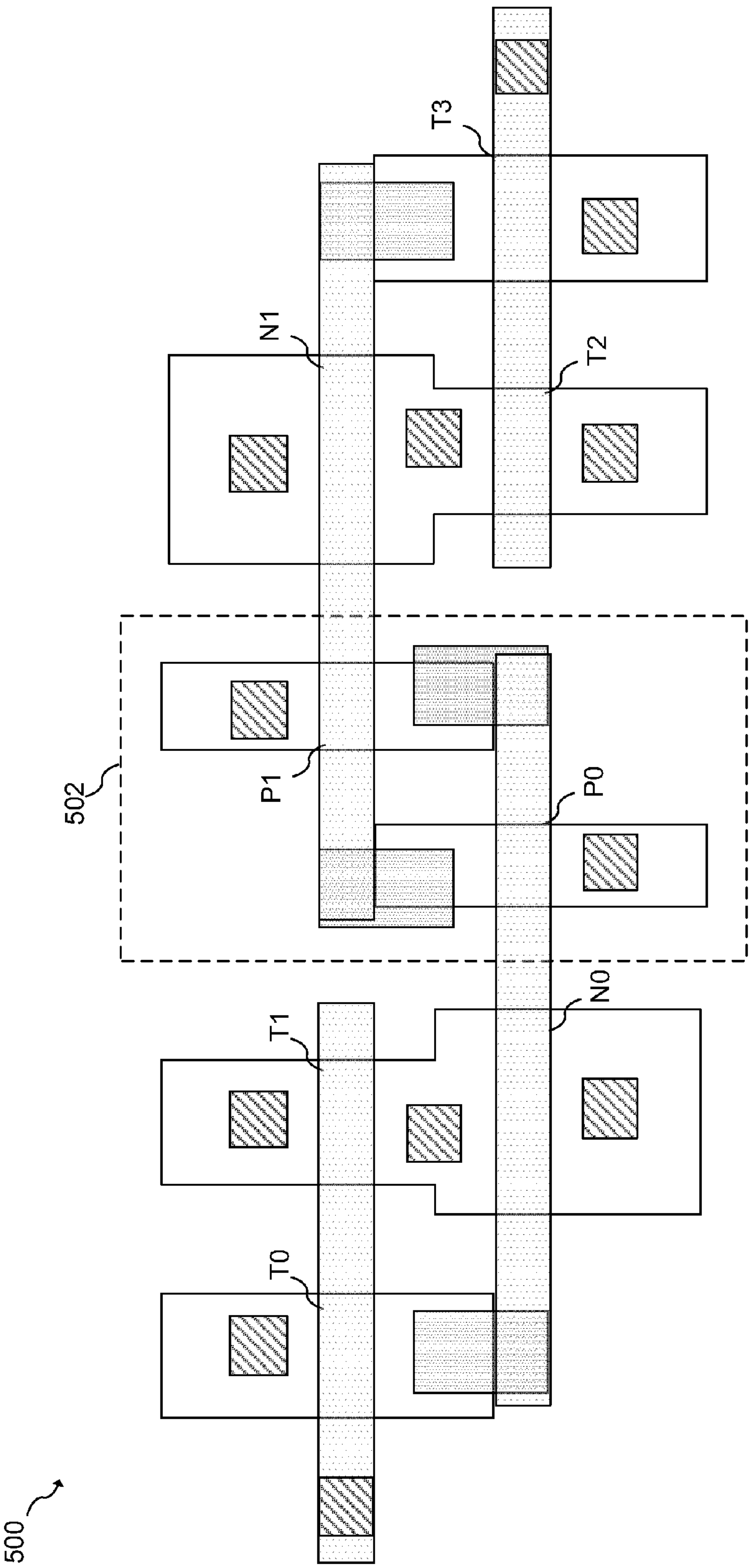
FIG. 6 illustrates a layout of an embodiment of the dual port memory cell.

FIG. 6 illustrates a layout of embodiment eight-transistor memory cell 500 corresponding to eight-transistor memory 414 of FIG. 4 for a sub-90 nm CMOS process. PMOS devices P0 and P1 reside in n-well 502, while remaining NMOS devices T0, T1, T2, T3, N0 and N1 are disposed outside of n-well 502. The gate lengths and widths of these devices are sized using design techniques known in the art according to the particular process technology used, and according to the specifications and requirements of the memory cell being designed.

In an embodiment, a memory includes a memory cell, a first access device coupled between the memory cell and a first bit line, and a second access device coupled between the memory and a second bit line, and a third access device coupled between the first bit line and the second bit line. The first bit line corresponds to a first memory port, and the second bit line corresponds to a second memory port. The memory also includes control logic configured to activate the third access device switch and deactivate the second access device if the first memory port and the second memory port simultaneously access the memory cell. In one embodiment, the memory cell is disposed within a memory array. In some embodiments, the memory array is disposed on an integrated circuit.

In a further embodiment, the memory also includes a fourth access device coupled between the second access device and the third access device to isolate a load of the second bit line. The control logic is further configured to deactivate the fourth access device if the first memory port and the second memory port simultaneously access the memory cell.

In one embodiment, the memory cell includes a plurality of cross-coupled inverters, the first access device is implemented by a first access transistor, the second access device is implemented by a second access transistor, and the third access device comprises a third transistor. In an embodiment, the cross-coupled inverters, the first access device and the second access device are sized to handle a current load of one-bit line. In an embodiment, the first bit line comprises a first differential bit line pair, the second bit line comprises a second differential bit line pair, and the first access transistor, second access transistor, and third transistor each comprise a pair of transistors.

In an embodiment, the memory also includes a first sense amplifier coupled to the first bit line and a second sense amplifier coupled to the second bit line. In a further embodiment, the memory also includes a first bit select device coupled between the first sense amplifier and the memory cell, and a second bit select device coupled between the second sense amplifier and the memory cell.

In an embodiment, the first access device has a first control node coupled to a first word line, the second access device has a second control node coupled to a second word line output, and the control logic disables the second word line output if the first word line and a second word line input are both active.

In an embodiment, a semiconductor circuit includes a memory array comprising memory cells. Each memory cell has a storage unit, a first access transistor coupling the storage unit to a first bit line, and a second access transistor coupling the storage unit to a second bit line. The semiconductor circuit also includes a further access transistor coupling the first bit line to a sense amplifier of the second bit line, and a control circuit deactivating the second access transistor and activating the further access transistor if a first memory port and a second memory port are accessing from a same memory cell. In an embodiment, the first access transistor is implemented by a plurality of first access transistors, the second access transistor is implemented by a plurality of second access transistors, and the further access transistor is implemented by a plurality of further access transistors. In an embodiment, the first bit line comprises a differential bit line, and the second bit line comprises a differential bit line. In an embodiment, the semiconductor circuit further includes a first sense amplifier coupled to the first bit line.

In some embodiments, the memory array comprises a dual-port memory array, and in some embodiment, the memory cells comprise SRAM memory cells. In an embodiment, the memory cell, the first access transistor, and the second access transistor comprise a dual port memory cell. In an embodiment, the memory cell, the first access transistors, and the second access transistor are sized to handle currents of a single word line access, but not simultaneous word line access.

In an embodiment, a method of operating a memory cell coupled to a first port and to a second port includes the step of determining if a first port is requesting to access the memory cell, and the step of determining if a second port is requesting to access the memory cell. If the first port and the and the second port are simultaneously requesting to access the memory cell, the second port is deactivated, the memory cell is accessed from the first port, and an access memory state is propagated from the first port to circuitry associated with the second port.

In an embodiment, the method further includes accessing the memory cell from the port line if the first port is requesting to access the memory cell and the second port is not requesting to access the memory cell. If the first port is not requesting to access the memory cell and the second port is requesting to access the memory cell, the memory cell is accessed from the second port.

In an embodiment, the step of determining if the first port is requesting to access the memory cell includes monitoring a first input word line, and the step of determining if the second port is requesting to access the memory cell includes monitoring a second input word line. In an embodiment, the step of deactivating the second port includes shutting off a second access transistor coupled between the memory cell and a second bit line associated with the second port, and the step of accessing the memory cell from the first port includes activating a first access transistor coupled between the memory cell and a first bit line associated with the first port, and detecting a signal level on the first bit line. In an embodiment, the first bit line includes a first differential bit line pair, the second bit line comprises a first differential bit line pair, the first access transistor comprises a first access transistor pair; the second access transistor comprises a second access transistor pair.

In an embodiment, the step of propagating the accessed memory state from the first port to circuitry associated with the second port includes activating a third access transistor coupled between the first bit line and a sense amplifier associated with the second port. In a further embodiment, deactivating the second bit line further includes deactivating a fourth access transistor coupled between the sense amplifier associated with the second port and the second bit line.

In an embodiment, a method of manufacturing a dual-port memory includes determining device sizes of a memory cell, a first access transistor, and a second access transistor meet performance specifications for driving a single bit line. The method also includes forming the memory cell, the first access transistor and the second access transistor on a semiconductor substrate according to the determined device sizes, forming a first bit line associated with a first memory port and a second bit line associated with a second memory port on the semiconductor substrate, coupling a first access transistor to the first bit line, and coupling a second access transistor to the second bit line. The method further includes forming a control circuit configured to detect a simultaneous access request from a first memory port and a second memory port. If the simultaneous access request is detected, the first access transistor is activated, the second access transistor is deactivated, a state of the memory cell is accessed via the first access transistor, the state of the memory cell is propagated over the first port and the second port Advantages of embodiments include the ability to use a smaller, more compact size memory cell in a dual port memory, and still maintain performance with respect to access and write time, and stability. Other advantages include possible reduction of leakage and standby current due to the use of smaller devices.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a memory cell coupled to a first port and to a second port, the method comprising:
- determining if the first port is requesting to access the memory cell,
- determining if the second port is requesting to access the memory cell,
- based on the determining, if the first port and the second port are simultaneously requesting to access the memory cell,
  - deactivating the second port,
  - accessing the memory cell from the first port, and
  - propagating an access memory state from the first port to circuitry associated with the second port, wherein:
- deactivating the second port comprises shutting off a second access transistor coupled between the memory cell and a second bit line associated with the second port; and
- accessing the memory cell from the first port comprises activating a first access transistor coupled between the memory cell and a first bit line associated with the first port, and detecting a signal level on the first bit line.

2. The method of claim 1, further comprising
- based on the determining, if the first port is requesting to access the memory cell and the second port is not requesting to access the memory cell,
  - accessing the memory cell from the first port; and
- based on the determining, if the first port is not requesting to access the memory cell and the second port is requesting to access the memory cell,
  - accessing the memory cell from the second port.

3. The method of claim 1, wherein:
- determining if the first port is requesting to access the memory cell comprises monitoring a first input word line; and
- determining if the second port is requesting to access the memory cell comprises monitoring a second input word line.

4. The method of claim 1, wherein:
- the first bit line comprises a first differential bit line pair;
- the second bit line comprises a second differential bit line pair;
- the first access transistor comprises a first access transistor pair; and
- the second access transistor comprises a second access transistor pair.

5. The method of claim 1, wherein propagating the accessed memory state from the first port to circuitry associated with the second port comprises activating a third access transistor coupled between the first bit line and a sense amplifier associated with the second port.

6. The method of claim 5, wherein deactivating the second port further comprises deactivating a fourth access transistor coupled between the sense amplifier associated with the second port and the second bit line.

7. A memory comprising:
- a memory cell;
- a first access device coupled between the memory cell and a first bit line, the first bit line corresponding to a first memory port;
- a second access device coupled between the memory and a second bit line, the second bit line corresponding to a second memory port;
- a third access device coupled between the first bit line and the second bit line;
- control logic configured to activate the third access device and deactivate the second access device if the first memory port and the second memory port simultaneously access the memory cell; and
- a fourth access device coupled between the second access device and the third access device to isolate a load of the second bit line, wherein the control logic is further configured to deactivate the fourth access device if the first memory port and the second memory port simultaneously access the memory cell.

8. A memory comprising:
- a memory cell;
- a first access device coupled between the memory cell and a first bit line, the first bit line corresponding to a first memory port;
- a second access device coupled between the memory and a second bit line, the second bit line corresponding to a second memory port;
- a third access device coupled between the first bit line and the second bit line; and
- control logic configured to activate the third access device and deactivate the second access device if the first memory port and the second memory port simultaneously access the memory cell;
- wherein the memory cell comprises a plurality of cross-coupled inverters;
- wherein the first access device comprises a first access transistor;
- wherein the second access device comprises a second access transistor; and
- wherein the third access device comprises a third transistor.

9. The memory of claim 8, wherein the cross-coupled inverters, the first access device and the second access device are sized to handle a current load of one-bit line.

10. The memory of claim 8, wherein:

the first bit line comprises a first differential bit line pair;

the second bit line comprises a second differential bit line pair; and the first access transistor, second access transistor, and third transistor each comprise a pair of transistors.

11. A memory comprising:

a memory cell;

a first access device coupled between the memory cell and a first bit line, the first bit line corresponding to a first memory port;

a second access device coupled between the memory and a second bit line, the second bit line corresponding to a second memory port;

a third access device coupled between the first bit line and the second bit line;

control logic configured to activate the third access device and deactivate the second access device if the first memory port and the second memory port simultaneously access the memory cell;

a first sense amplifier coupled to the first bit line; and a second sense amplifier coupled to the second bit line;

a first bit select device coupled between the first sense amplifier and the memory cell; and a second bit select device coupled between the second sense amplifier and the memory cell.

12. The memory of claim 11, wherein the memory cell is disposed within a memory array.

13. A memory comprising:

a memory cell;

a first access device coupled between the memory cell and a first bit line, the first bit line corresponding to a first memory port;

a second access device coupled between the memory and a second bit line, the second bit line corresponding to a second memory port;

a third access device coupled between the first bit line and the second bit line; and control logic configured to activate the third access device and deactivate the second access device if the first memory port and the second memory port simultaneously access the memory cell;

wherein the first access device comprises a first control node coupled to a first word line;

wherein the second access device comprises a second control node coupled to a second word line output; and wherein the control logic disables the second word line output if the first word line and a second word line input are both active.

14. A semiconductor circuit comprising:

a memory array comprising memory cells, each memory cell comprising a storage unit, a first access transistor coupling the storage unit to a first bit line, and a second access transistor coupling the storage unit to a second bit line;

an further access transistor coupling the first bit line to a sense amplifier of the second bit line; and a control circuit deactivating the second access transistor and activating the further access transistor if a first memory port and a second memory port are accessing from a same memory cell:

wherein the first access transistor comprises a plurality of first access transistors;

wherein the second access transistor comprises a plurality of second access transistors;

wherein the further access transistor comprises a plurality of further access transistors;

wherein the first bit line comprises a differential bit line; and wherein the second bit line comprises a differential bit line.

15. The semiconductor circuit of claim 14, wherein the memory array comprises a dual-port memory array.

16. The semiconductor circuit of claim 14, wherein the memory cells comprise SRAM memory cells.

17. The semiconductor circuit of claim 14, wherein:

the memory cell, the first access transistor, and the second access transistor comprise a dual port memory cell; and the memory cell, the first access transistors, and the second access transistor are sized to handle currents of a single word line access, but not simultaneous word line access.

18. The semiconductor circuit of claim 14, further comprising a first sense amplifier coupled to the first bit line.

19. A method of operating a memory cell coupled to a first port and to a second port, the method comprising:

determining that the memory cell is to be simultaneously read by both the first port and the second port;

deactivating the second port; and propagating an access memory state from the first port to a first sense amplifier associated with the first port and also from the first port to a second sense amplifier associated with the second port.

20. The method of claim 19, further comprising:

determining that the first port is requesting to access the memory cell and the second port is not requesting to access the memory cell; and accessing the memory cell from the first port.

21. The method of claim 19, further comprising:

determining that the second port is requesting to access the memory cell and the first port is not requesting to access the memory cell;

reactivating the second port; and accessing the memory cell from the second port.

22. The method of claim 19, wherein determining that the memory cell is to be simultaneously read comprises monitoring first and second input word lines.

23. The method of claim 19, wherein deactivating the second port comprises shutting off a second access transistor coupled between the memory cell and a second bit line associated with the second port; and wherein propagating the access memory state comprises activating a first access transistor coupled between the memory cell and a first bit line associated with the first port, and detecting a signal level on the first bit line.

24. The method of claim 23, wherein propagating the accessed memory state from the first port to the second sense amplifier comprises activating a third access transistor coupled between the first bit line and the second sense amplifier.

25. The method of claim 24, wherein deactivating the second port further comprises deactivating a fourth access transistor coupled between the sense amplifier associated with the second port and the second bit line.

26. The method of claim 23, wherein:

the first bit line comprises a first differential bit line pair;

the second bit line comprises a second differential bit line pair;

the first access transistor comprises a first access transistor pair; and the second access transistor comprises a second access transistor pair.

* * * * *